(12) United States Patent
Ehemann et al.

(10) Patent No.: US 9,512,029 B2
(45) Date of Patent: Dec. 6, 2016

(54) COVER GLASS ARTICLE

(71) Applicants: Karl David Ehemann, Horseheads, NY (US); Keith Raymond Gaylo, Painted Post, NY (US); William Brashear Mattingly, III, Painted Post, NY (US); Connor Thomas O'Malley, Painted Post, NY (US); Ljerka Ukrainczyk, Painted Post, NY (US); Kevin Lee Wasson, Elmira, NY (US)

(72) Inventors: Karl David Ehemann, Horseheads, NY (US); Keith Raymond Gaylo, Painted Post, NY (US); William Brashear Mattingly, III, Painted Post, NY (US); Connor Thomas O'Malley, Painted Post, NY (US); Ljerka Ukrainczyk, Painted Post, NY (US); Kevin Lee Wasson, Elmira, NY (US)

(73) Assignee: Corning Incorporated, Corning, NY (US)

( * ) Notice: Subject to any disclaimer, the term of this patent is extended or adjusted under 35 U.S.C. 154(b) by 15 days.

(21) Appl. No.: 13/774,238

(22) Filed: Feb. 22, 2013

(65) Prior Publication Data
US 2013/0323444 A1    Dec. 5, 2013

Related U.S. Application Data

(60) Provisional application No. 61/653,476, filed on May 31, 2012.

(51) Int. Cl.
C03C 3/00      (2006.01)
C03C 21/00     (2006.01)
C03B 23/023    (2006.01)

(52) U.S. Cl.
CPC ............... *C03C 3/00* (2013.01); *C03B 23/023* (2013.01); *C03C 21/002* (2013.01); *Y10T 428/131* (2015.01)

(58) Field of Classification Search
CPC ........ C03B 23/023; C03B 21/002; C03B 3/00; Y10T 428/131; C03C 3/00; C03C 21/002; C03C 23/007; C03C 2204/00
(Continued)

(56) References Cited

U.S. PATENT DOCUMENTS 4,081,263 A    3/1978  Mestre et al.
4,164,402 A    8/1979  Watanabe
(Continued)

FOREIGN PATENT DOCUMENTS

CN    1501697       6/2004
CN    102740623     10/2012
(Continued)

OTHER PUBLICATIONS

René Gy, Ion exchange for glass strengthening, Materials Science and Engineering: B, vol. 149, Issue 2, Mar. 25, 2008, pp. 159-165, ISSN 0921-5107, http://dx.doi.org/10.1016/j.mseb.2007.11.029. (http://www.sciencedirect.com/science/article/pii/S0921510707006599).*
(Continued)

*Primary Examiner* — Yan Lan
(74) *Attorney, Agent, or Firm* — John T. Haran

(57) ABSTRACT

A cover glass article includes a glass body having a three-dimensional shape, an inside surface, and an outside surface. Each of the inside and outside surfaces has a surface roughness ($R_a$) less than 1 nm and is free of indentations having diameters larger than 150 μm.

36 Claims, 4 Drawing Sheets

(58) Field of Classification Search
USPC ......... 428/34.4, 426, 332; 65/104, 105, 107; 501/55, 65, 66, 68
See application file for complete search history.

(56) References Cited

U.S. PATENT DOCUMENTS

| | | | |
|---|---|---|---|
| 4,397,669 A | 8/1983 | Haisma et al. | |
| 4,422,863 A | 12/1983 | Hosoya et al. | |
| 4,597,279 A | 7/1986 | Lisec | |
| 5,013,348 A | 5/1991 | Hirota | |
| 6,935,137 B2 | 8/2005 | Kerenyi et al. | |
| 7,000,430 B1 | 2/2006 | Fotheringham et al. | 65/33.2 |
| 7,017,370 B1 | 3/2006 | Fotheringham et al. | 65/33.2 |
| 8,187,987 B2 | 5/2012 | Amin et al. | |
| 8,201,452 B2 | 6/2012 | Oldsen et al. | |
| 8,748,002 B2 | 6/2014 | Murata | |
| 2003/0125188 A1 | 7/2003 | Koyoma et al. | |
| 2004/0206123 A1 | 10/2004 | Fotheringham et al. | 65/103 |
| 2010/0000259 A1* | 1/2010 | Ukrainczyk et al. | 65/104 |
| 2010/0055395 A1* | 3/2010 | Ukrainczyk | 428/141 |
| 2010/0129602 A1 | 5/2010 | Dejneka | |
| 2011/0003619 A1 | 1/2011 | Fujii | |
| 2011/0079048 A1 | 4/2011 | Shelestak et al. | |
| 2011/0092353 A1 | 4/2011 | Amin et al. | |
| 2011/0126588 A1 | 6/2011 | Malach et al. | |
| 2011/0165380 A1 | 7/2011 | Gahagan et al. | |
| 2011/0209634 A1 | 9/2011 | Sabia et al. | |
| 2011/0274916 A1* | 11/2011 | Murata | C03C 3/11 428/332 |
| 2011/0281072 A1* | 11/2011 | Sabia et al. | 428/156 |
| 2011/0294649 A1 | 12/2011 | Gomez et al. | |
| 2012/0052275 A1 | 3/2012 | Hashimoto et al. | |
| 2012/0083401 A1 | 4/2012 | Koyama et al. | |
| 2012/0131961 A1 | 5/2012 | Dannoux et al. | |
| 2012/0134025 A1 | 5/2012 | Hart | |
| 2012/0270016 A1 | 10/2012 | Hashimoto et al. | |
| 2012/0275100 A1 | 11/2012 | Pakula et al. | 361/679.01 |
| 2012/0288661 A1 | 11/2012 | Wei | 428/64.1 |
| 2012/0297828 A1 | 11/2012 | Bailey et al. | |
| 2012/0308827 A1 | 12/2012 | Boek et al. | |
| 2012/0329525 A1 | 12/2012 | Hashimoto et al. | |
| 2013/0189486 A1 | 7/2013 | Wang et al. | 428/141 |
| 2013/0298608 A1 | 11/2013 | Langsdorf et al. | 65/103 |

FOREIGN PATENT DOCUMENTS

| | | |
|---|---|---|
| CN | 102099308 | 4/2014 |
| DE | 102010020439 | 11/2011 |
| EP | 2457881 A1 * | 5/2012 |
| EP | 2540682 A1 | 1/2013 |
| JP | 4357174 | 8/2009 |
| JP | 5046075 | 7/2012 |
| WO | 2005080285 A1 | 9/2005 |
| WO | WO2010/084670 * | 7/2010 |
| WO | 2011103799 A1 | 9/2011 |
| WO | 2011141295 A1 | 11/2011 |
| WO | 2011144024 A1 | 11/2011 |
| WO | 2012037094 A2 | 3/2012 |
| WO | 2012118612 A1 | 9/2012 |
| WO | 2012126394 A1 | 9/2012 |
| WO | 2012150476 A1 | 11/2012 |

OTHER PUBLICATIONS

American Federation of Mineralogical Societies, "Mohs Scale of Mineral Hardness" May 16, 2010. (http://web.archive.org/web/20100516034340/http:/www.amfed.org/t_mohs.htm).*
Lauren Drell, "How Super Strong Glass Keeps Your Smartphone Screen From Breaking," Oct. 17, 2011. (http://mashable.com/2011/10/17/gorilla-glass/).*
Klug, Brian et al., "The Apple iPad 2 Review," AnandTech, Mar. 19, 2011. (http://www.anandtech.com/show/4225/the-ipad-2-review/13).*
Kolokowsky, Steve, "Not All Touchscreens are Created Equal—How to Ensure You Are Developing a World Class Touch Product," Mar. 2010. (http://www.cypress.com/?docID=21351).*
Fabrication of glasses with low softening temperatures for mold-processing by ion-exchange, 116 Journal of the Ceramic Society of Japan 875-879 (2008).
CO(2) Laser Scribe of Chemically Strengthened Glass with High Surface Compressive Stress, 7320 Laser Applications in Microelectronic and Optoelectronic Manufacturing, (2011).
"Specification Schott D 263 T eco TP," Advanced Materials, Jan. 1, 2009 (Jan. 1, 2009), pp. 1-11.
Donnell Walton et al: "Speciality Glass: A New Design Element in Consumer Electronics", Electronic Design, Jul. 12, 2010 (Jul. 1, 2010), pp. 1-4.
European Patent Office, Written Opinion of the International Searching Authority, Dec. 6, 2013, pp. 1-7.
European Patent Office, Notification of Transmittal of the International Search Report and the Written Opinion of the International Searching Authority, or The Declaration, Dec. 6, 2013, pp. 1-5.
Chinese First Office Action CN201380028524.5 Dated Jul. 4, 2016, Shanghai Patent and Trademark Law Office, LLC. 16 Pgs.
Taiwan Office Action and Search TW102118782 Dated Sep. 14, 2016, Tsai, Lee and Chen. 5 Pgs.
Zhang Rui et al., "Glass Technology", pp. 154 and 109, Chemical Industry Press, published on Aug, 2008.

* cited by examiner

Figure 3
Figure 3A
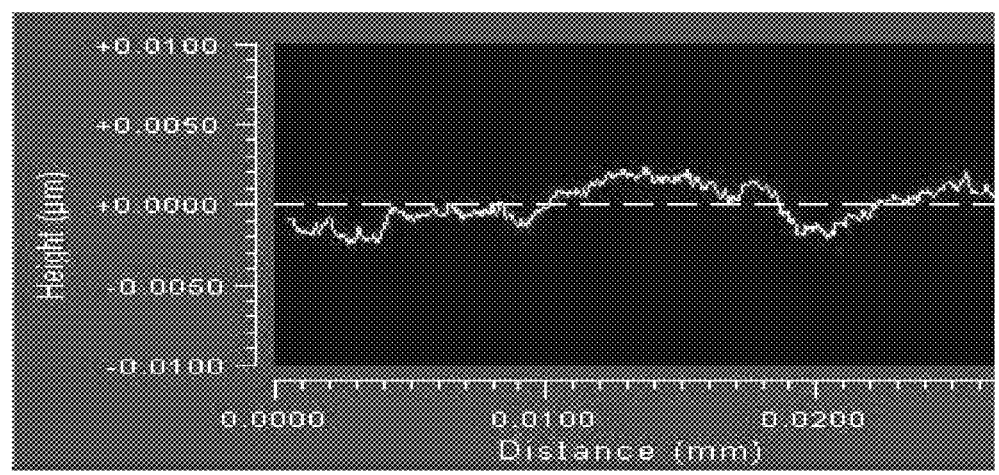
Figure 3B
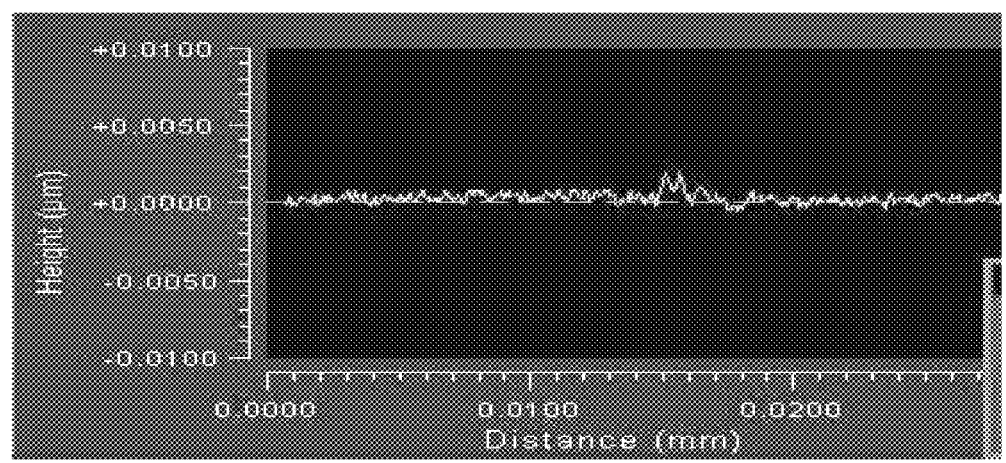

COVER GLASS ARTICLE

This application claims the benefit of priority under 35 USC §119 of U.S. Provisional Application Ser. No. 61/653,476 filed May 31, 2012, the content of which is relied upon and incorporated herein by reference in its entirety.

FIELD

The present invention relates to covers for mobile or handheld electronic devices.

BACKGROUND

Covers for handheld devices are required to be aesthetically pleasing while being functional. Glass is one of the materials that can be used to make such covers. The present invention relates to a shaped glass article with attributes that make it useful as a cover glass.

SUMMARY

In one aspect, a cover glass article includes a glass body having a three-dimensional shape, an inside surface, and an outside surface. Each of the inside and outside surfaces has a surface roughness ($R_a$) less than 1 nm and is free of indentations having diameters larger than 150 μm. In some embodiments, each of the inside and outside surfaces has a surface roughness ($R_a$) less than 0.7 nm. In some embodiments, at least one of the inside and outside surfaces has a surface roughness ($R_a$) less than 0.3 nm. In some embodiments, the glass body has a wall thickness in a range from 0.3 mm to 3 mm. In some embodiments, the variation in the wall thickness is less than ±100 μm. In other embodiments, the variation in the wall thickness is within ±10% or less.

In some embodiments, the glass body further comprises less than ten non-indentation defects observable by the unaided human eye at 1000 lux in a 25 mm×25 mm area on any of the surface.

In some embodiments, the glass body has a flat section. In some embodiments, the flatness of the flat section is better than ±150 μm over a 10 mm×10 mm area and in other embodiments the flatness of the flat section is better than ±50 μm over a 25 mm×25 mm area. In some embodiments, the glass body has at least one bend section. In some embodiments, the at least one bend section has a bend radius from about 1 mm to about 20 mm. In some embodiments, the at least one bend section is a spline. In some embodiments, the at least one bend section has a bend angle ranging from 0 to 90°. In some embodiments, the at least one bend section has a bend angle greater than 90°.

Embodiments may also have high optical transmission. In some embodiments, the glass body has an optical transmission greater than 85% in a wavelength range of 400 nm to 800 nm. In some embodiments, the glass body has an optical transmission greater than 90% in a wavelength range of 400 nm to 800 nm.

Embodiments may have improved strength or damage resistance. In some embodiments, the glass body has a compressive stress greater than 300 MPa. In some embodiments, the glass body has a hardness of greater than 7 on the Mohs scale. In some embodiments, the glass body is tempered and may be chemically or thermally tempered. In some embodiments the glass body comprises an ion exchanged glass. In some embodiments, the ion-exchanged class has a depth of layer of greater than 15 μm or greater than 25 μm.

Embodiments may be used in electronic devices. In some embodiments, the glass body is adapted for covering an electronic device having a flat display. In some embodiments, the electronic device is a telephone, monitor, television, handheld device, or tablet.

It is to be understood that both the foregoing general description and the following detailed description are exemplary of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

FIG. 3A shows a surface roughness profile of a side of a 3D glass article in contact with a mold with $R_a$=0.691 nm (average).

FIG. 3B shows a surface roughness profile of a side of a 3D glass article not in contact with a mold with $R_a$=0.2731 nm (average).

DETAILED DESCRIPTION

Figure 1:
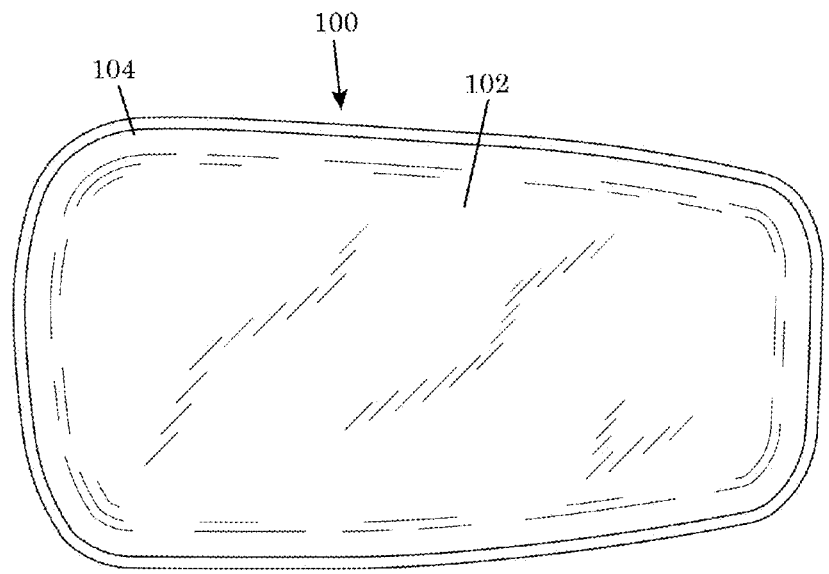
FIG. 1 shows one example of a cover glass shape.

The present embodiments can be understood more readily by reference to the following detailed description, drawings, examples, and claims, and their previous and following description. However, before the present compositions, articles, devices, and methods are disclosed and described, it is to be understood that this description is not limited to the specific compositions, articles, devices, and methods disclosed unless otherwise specified, as such can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made to the various embodiments described herein, while still obtaining the beneficial results. It will also be apparent that some of the desired benefits can be obtained by selecting some of the features without utilizing other features. Accordingly, those who work in the art will recognize that many modifications and adaptations to the present embodiments are possible and can even be desirable in certain circumstances and are a part of the present description. Thus, the following description is provided as illustrative and should not be construed as limiting.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the meanings detailed herein.

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise.

A three-dimensional (3D) cover glass according to one aspect of the present disclosure can be used to cover an electronic device having a display. In some embodiments, the display area is flat or planar. The 3D cover glass will protect the display while allowing viewing of and interaction with the display. The 3D cover glass has a front cover glass section for covering the front side of the electronic device, where the display is located, and one or more side cover glass sections for wrapping around the peripheral side of the electronic device. The front cover glass section is contiguous with the side cover glass section(s).

Another aspect comprises a three-dimensional (3D) cover glass for use as a cover for at least part of the back and side portions of an electronic device, referred to as a backplate. In some embodiments, the backplate is flat or planar. The backplate can protect the electronic components in the device and/or provide a scratch or damage resistant surface. The electronic device may also have a display on part or all of the back of the device, and in such cases, the backplate may have a planar surface over that region and may act as a second cover for the second display area. The back cover glass section is contiguous with the side cover glass section(s).

In some embodiments, the 3D cover glass has at least one flat or planar section. In some embodiments, this flat or planar section covers at least part of the display area of the electronic device. In some embodiments, the flat 3D cover glass has a flatness of better than ±10 µm, ±25 µm, ±50 µm, ±75 µm, ±100 µm, ±125 µm, ±150 µm, ±100 µm, ±200 µm, ±250 µm, ±300 µm, or ±400 µm over a 25 mm×25 mm area, as measured by a FLATMASTER® tool. In some embodiments, the flat 3D cover glass has a flatness of better than ±10 µm, ±25 µm, ±50 µm, ±75 µm, ±100 µm, ±125 µm, ±150 µm, ±100 µm, ±200 µm, ±250 µm, ±300 µm, or ±400 µm over a 200 mm×200 mm area, as measured by a FLATMASTER® tool. In one embodiment, the flat front cover glass section has a flatness of better than ±150 µm over a 25 mm×25 mm area, as measured by a FLATMASTER® tool. In one embodiment, the flat front cover glass section has a flatness of better than ±150 µm over a 200 mm×200 mm area, as measured by a FLATMASTER® tool. In one embodiment, the flat front cover glass section has a flatness of better than ±100 µm over a 200 mm×200 mm area, as measured by a FLATMASTER® tool. In one embodiment, the flat front cover glass section has a flatness of better than ±50 µm over a 200 mm×200 mm area, as measured by a FLATMASTER® tool. In one embodiment, the flat front cover glass section has a flatness of better than ±50 µm over a 25 mm×25 mm area, as measured by a FLATMASTER® tool. In another embodiment, the front cover glass section may be curved.

Another aspect of the 3D cover glass is the bend radius or curvature. The 3D cover glass has at least one curved surface, and in some embodiments, may comprise two or more bends. The bend may be constant, having a fixed radius with a constant center point, or may be variable, as in the case of a spline structure. In some embodiments, the bend is a complex bend that has a changing radius, such as described by a Burmester curve. The bend angle and radius can be selected based on the peripheral side geometry of the electronic device. In some embodiments, the bend angle is from greater than 0° to 90°. In some embodiments, the bend angle can be greater than 90°. In some embodiments, the bend radius is about 1 mm or greater. In some embodiments, the bend radius is from about 1 mm to about 20 mm, about 1 to about 15 mm, about 1 mm to about 10 mm, about 1 mm to about 5 mm, about 2 mm to about 20 mm, about 2 to about 15 mm, about 2 mm to about 10 mm, about 2 mm to about 5 mm, about 5 to about 15 mm, about 5 mm to about 10 mm, or about 1 mm to about 20 mm. In some embodiments, the bend radius is about 0.25, 0.5, 0.75, 1.0, 1.25, 1.5, 1.75, 2.0, 2.25, 2.5, 2.75, 3.0, 3.5, 4.0, 4.5, 5.0, 6.0, 7.0, 8.0, 9.0, 10.0, 15.0, 20.0 mm or more.

Figure 2:
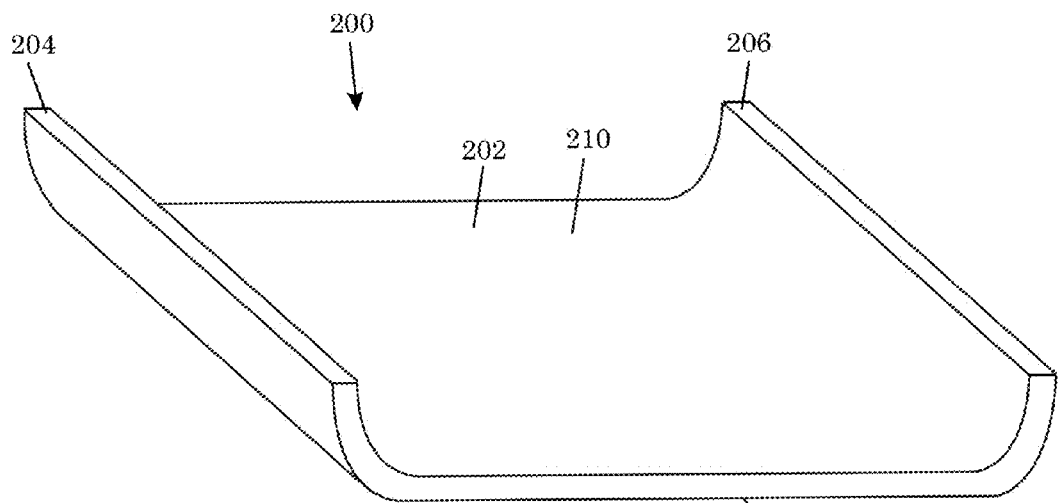
FIG. 2 shows another example of a cover glass shape.

Non-limiting examples of 3D cover glasses are shown in FIGS. 1 and 2. In FIG. 1, the 3D cover glass 100 has a front cover glass section 102 and a side cover glass section 104. The side cover glass section 104 circumscribes the front cover glass section 102 and includes a bend, giving the 3D cover glass 100 a dish shape. In FIG. 2, the 3D cover glass 200 has a front cover glass section 202 and side cover glass sections 204, 206. The side cover glass sections 204, 206 are on opposite sides of the front cover glass section 202.

In some embodiments, the 3D cover glass is made from a 2D glass sheet using a thermal reforming process such as described in U.S. Patent Application Publication No. 2010/0000259 (Ukrainczyk, "Method of Making Shaped Glass Articles"), European Patent Application No. 10306317.8 (Corning Incorporated, "Method and Apparatus for Bending a Sheet of Material into a Shaped Article"), U.S. patent application Ser. No. 13/480,172 (Bailey et al., "Glass Molding System and Related Apparatus and Method"), U.S. Provisional Application No. 61/545,332, and U.S. Provisional Application No. 61/545,329, all incorporated by reference. In some embodiments, the 2D glass sheet is made by a fusion process. Although, 2D glass sheets made by other processes, such as the float or rolling, may also be used.

Another aspect comprises the uniformity of wall thickness of the glass sheet. When glass is bent or manipulated, the thickness of the sheet ("wall thickness") can vary in the bend regions, which can lead to optical distortion and weakened glass strength. The current process uniquely preserves the uniformity of the glass across the surface and in the bend regions. The 3D cover glass has a uniform wall thickness typically in a range from 0.3 mm to 3 mm. In some embodiments, the thickness is about 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 mm. In one embodiment, the total variation in the wall thickness of the cover glass wall is within ±100 µm. In another embodiment, the total variation in the wall thickness of the cover glass wall is within ±10 µm, ±20 µm, ±30 µm, ±40 µm, ±50 µm, ±60 µm, ±70 µm, ±80 µm, ±90 µm, ±100 µm, ±125 µm, ±150 µm, ±200 µm, or ±250 µm of the average wall thickness of the of the glass sheet. In some embodiments, the total variation in the wall thickness of the cover glass wall is ±10% of the average wall thickness of the glass sheet. In some embodiments, the total variation in the wall thickness of the cover glass wall is ±3% of the average wall thickness of the glass sheet. In some embodiments, the total variation in the wall thickness of the cover glass wall is ±20%, ±15%, ±10%, ±9%, ±8%, ±7%, ±6%, ±5%, ±4%, ±3%, ±2%, or ±1% of the average wall thickness of the glass sheet.

The 3D cover glass has an inside surface and an outside surface. For illustration purposes, inside surface 210 and outside surface 212 are indicated in FIG. 2. When the 3D cover glass 200 is placed on an electronic device, the inside surface 210 would be on the inside of the assembly, whereas the outside surface 212 would be on the outside of the assembly. FIG. 1 shows an inside surface 106 and an outside surface 108. Each surface is smooth, and this smoothness can be characterized by surface roughness. In some embodiments, the inside and outside surfaces have different surface roughness. In some embodiments, the average surface roughness ($R_a$) of each surface of the 3D cover glass is less than 1 nm. In another embodiment, the average surface roughness of each surface of the 3D cover glass is less than 0.7 nm. In some embodiments, the average surface roughness ($R_a$) of each surface of the 3D cover glass is less than 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 nm. In another embodiment, the average surface roughness ($R_a$) of at least one of the surfaces of the 3D cover glass is less than 0.3 nm. In some embodiments, the average surface roughness ($R_a$) of at least one of the surfaces of the 3D cover glass is less than 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 nm. In some embodiments, the average surface roughness ($R_a$) of at least one of the surfaces of the 3D cover glass is about 0.1 nm to about 3.0 nm, about 0.1 nm to about 2.0 nm, about 0.1 nm to about 1.5 nm, about 0.1 nm to about 1.0 nm, about 0.2 nm to about 3.0 nm, about 0.2 nm to about 2.0 nm, about 0.2 nm to about 1.5 nm, about 0.2 nm to about 1.0 nm, about 0.4 nm to about 3.0 nm, about 0.4 nm to about 2.0 nm, about 0.4 nm to about 1.5 nm, about 0.4 nm to about 0.7 nm, or about 0.4 nm to about 1.0 nm.

The surface roughness of the inside and outside surfaces may be the same or different. The latter may be the case, for example, if the 3D cover glass is made by a mold and only one of the surfaces comes into contact with the mold during forming of the 3D cover glass. Typically, the surface of the 3D cover glass contacting the mold will be the outside surface. However, it is possible to design the mold such that the surface of the 3D cover glass not contacting the mold will be the outside surface.

FIG. 3A shows a surface roughness profile 300 of a first surface of a 3D cover glass that came into contact with a mold during forming of the 3D cover glass. The average surface roughness in FIG. 3A is 0.691 nm. FIG. 3B shows a surface roughness profile 302 of a second surface of the 3D cover glass that did not come into contact with the mold. The average surface roughness in FIG. 3B is 0.2731 nm. The 3D cover glass having the surface profiles in FIGS. 3A and 3B was made by a thermal reforming process.

For comparison purposes, Table 1 shows surface roughness, including peak-to-valley departure (PV), root mean square (rms), and average surface roughness ($R_a$) profiles of five 3D glass samples made by machining.

| Sample # | PV (nm) | rms (nm) | $R_a$ (nm) |
|---|---|---|---|
| 1 | 5.6 | 0.59 | 0.47 |
| 2 | 5.6 | 0.76 | 0.6 |
| 3 | 5.7 | 0.7 | 0.56 |
| 4 | 6.8 | 0.8 | 0.65 |
| 5 | 6.4 | 0.7 | 0.6 |

Figure 4:
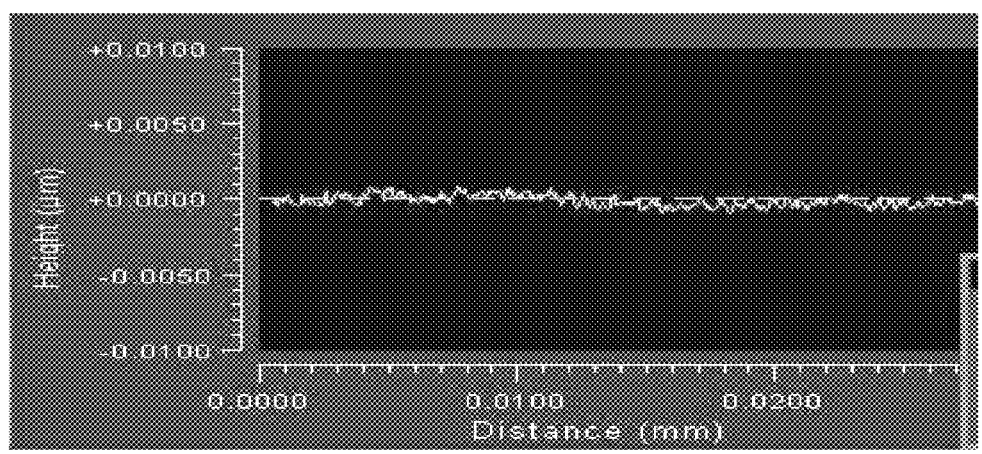
FIG. 4 shows a surface roughness profile of a flat fusion-formed glass $R_a$=0.2651 nm (average).

The average surface roughness ($R_a$) of these samples range from 0.4 nm to 0.7 nm. It is noted that the surface roughness of the first surface of the 3D glass article in FIG. 3A is comparable to the surface roughness achieved by machining. FIG. 4 shows a surface roughness of a flat pristine fusion formed glass. The average surface roughness ($R_a$) of the flat glass is 0.2651. It is noted that the surface roughness of the second surface of the 3D glass article in FIG. 3B is comparable to the surface roughness of the flat glass.

The surface roughness may be a function of the process of making the 2D glass or the 3D shaping process, and may also be affected by post processing, such as polishing. In some embodiments, the 3D cover glass is not subjected to post processing or has the roughness profile as described above prior to any post processing.

Ideally, the as-formed quality of the 3D cover glass would be as good as the glass sheet from which it is formed. For the most economical process, one desires that this surface quality is achieved without further rework or polishing of the as-formed surface. Defects, as used herein, include, but are not limited to, indentations (or dimples—depressions in the glass surface), surface checks/cracks, blisters, chips, cords, dice, observable crystals, laps, seeds, stones, and stria. In some embodiments, there are less than an average of 50, 40, 30, 20, 10, 5, 4, 3, 2, or 1 defects that are observable by the unaided human eye at 1000 lux in a 25 mm×25 mm area on any of the surfaces. In some embodiments, there are less than an average of 50, 40, 30, 20, 10, 5, 4, 3, 2, or 1 defects that are 150 µm in the largest dimension in a 25 mm×25 mm area on any of the surfaces, as measured by optical microscopy. In some embodiments, there are less than an average of 50, 40, 30, 20, 10, 5, 4, 3, 2, or 1 defects that are 150 µm in the largest dimension in a 25 mm×25 mm area on one of the surfaces—interior or exterior—as measured by optical microscopy. In some embodiments, the defect is 1, 2, 3, 5, 10, 20, 30, 40, 50, 60, 70, 80, 90, 100, 125, or 150 μm in the largest dimension.

In some embodiments, there are less than an average of 50, 40, 30, 20, 10, 5, 4, 3, 2, or 1 indentations (or dimples) larger than 150 μm in diameter in an 25 mm×25 mm area on any of the surfaces, as measured by optical microscopy. In some embodiments, the surfaces of the 3D cover glass are essentially flawless. By "essentially flawless," it is meant that there are no indentations (or dimples) larger than 150 μm in diameter, as measured by an optical microscopy technique, in the surfaces. In some embodiments, essentially flawless further comprises that there are no additional defects observable by the unaided human eye at 1000 lux on any of the surfaces.

Figure 5:
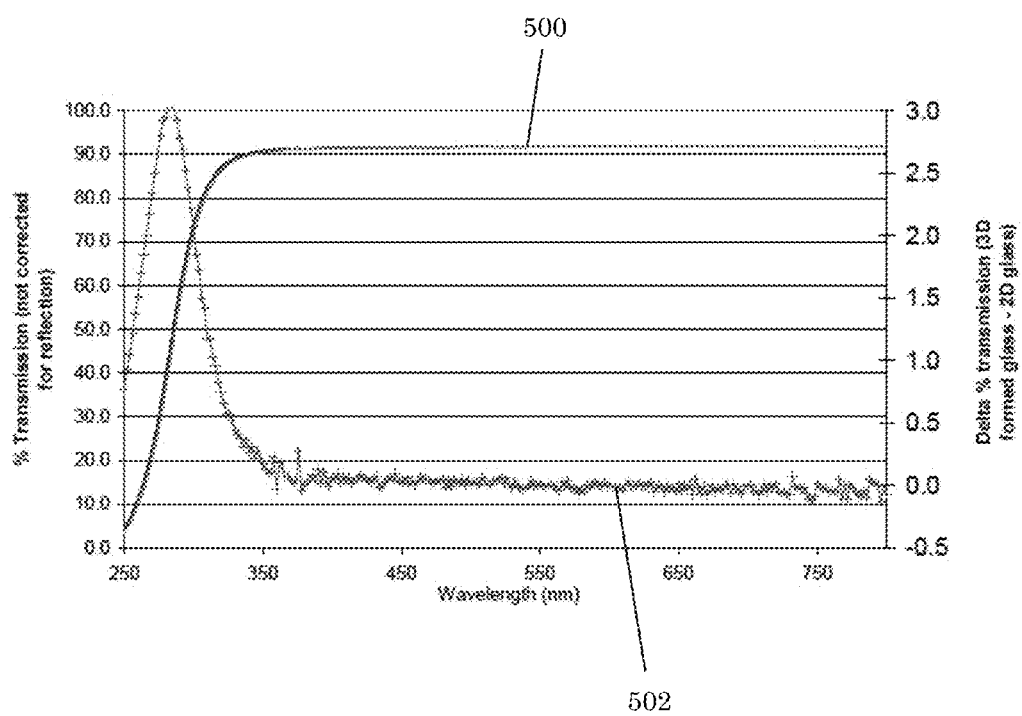
FIG. 5 is a transmission profile of a 3D cover glass.

In one embodiment, the 3D cover glass is transparent and has an optical transmission greater than 85% in a wavelength range of 400 nm to 800 nm. In some embodiments, the 3D cover glass is transparent and has an optical transmission greater than 75%, 80%, 85%, 87%, 90%, 93%, or 95% in a wavelength range of 400 nm to 800 nm. FIG. 5 shows a transmission profile 500 of an example 3D cover glass. Also shown in FIG. 5 is a delta profile 502 that represents the percent difference between the transmission of the 3D cover glass and a 2D fusion-formed glass.

A coating may be deposited on a surface of the 3D cover glass to make a portion of the 3D cover glass semi-transparent or opaque. The portion of the 3D cover glass in which the coating is not deposited can be a clear aperture on the front cover glass section, which would allow for viewing of and interaction with an electronic device display.

Another aspect comprises the resistance of the 3D cover glass to damage. A number of processes, such as tempering, increase the ability of a glass substrate to sustain shock and stress without being damaged. The 3D cover glass (or the 2D glass sheet used in making the 3D cover glass) can be subjected to a strengthening process to achieve the compressive stress that is greater than 300 MPa. In some embodiments, the glass is chemically or thermally tempered. In some embodiments, the glass is chemically tempered. In some embodiments, the glass is ion exchanged. In some embodiments, the 3D cover glass is subjected to an ion-exchange chemical strengthening process to achieve a combination of a compressive stress greater than 300 MPa and an ion-exchange depth of layer of at least 25 μm. In some embodiments, the ion-exchange depth of layer is at least 10, 15, 20, 25, 30, 35, 40, 45, or 50 μm. In some embodiments, the ion-exchange depth of layer is from about 10 μm to about 100 μm. The ion-exchange depth of layer is measured from a surface of the glass into the glass. An ion-exchanged layer is characterized by the presence of oversized ions in the glass lattice structure.

In some embodiments, the damage resistance of the 3D cover glass may be measured in terms of compressive stress. In some embodiments, the compressive stress at surface of glass greater than 300 MPa. In one embodiment, the cover glass has a compressive stress greater than 250, 300, 350, 400, 450, 500, 550, 600, 650, 700, 750, 800, 850, 900, 950, 1000 MPa or more.

In some embodiments, the damage resistance of the 3D cover glass may be measured in terms of hardness and/or scratch resistance. In one embodiment, the 3D cover glass has a hardness greater than 7 on the Mohs scale. In some embodiments, the 3D cover glass has a hardness of about 6, 6.3, 6.5, 6.7, 7.0, 7.3, 7.5, 7.7, 8, 8.3, 8.5, 8.7, or 9 on the Mohs scale.

In one embodiment, the 3D cover glass comprises an alkali aluminosilicate glass composition. An exemplary alkali aluminosilicate glass composition comprises from about 60 mol % to about 70 mol % $SiO_2$; from about 6 mol % to about 14 mol % $Al_2O_3$; from 0 mol % to about 15 mol % $B_2O_3$; from 0 mol % to about 15 mol % $Li_2O$; from 0 mol % to about 20 mol % $Na_2O$; from 0 mol % to about 10 mol % $K_2O$; from 0 mol % to about 8 mol % MgO; from 0 mol % to about 10 mol % CaO; from 0 mol % to about 5 mol % $ZrO_2$; from 0 mol % to about 1 mol % $SnO_2$; from 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+CaO≤10 mol %. (See, e.g., U.S. Pat. No. 8,158,543, incorporated by reference in its entirety.)

Another exemplary alkali-aluminosilicate glass composition comprises at least about 50 mol % $SiO_2$ and at least about 11 mol % $Na_2O$, and the compressive stress is at least about 900 MPa. In some embodiments, the glass further comprises $Al_2O_3$ and at least one of $B_2O_3$, $K_2O$, MgO and ZnO, wherein −340+27.1.$Al_2O_3$−28.7.$B_2O_3$+15.6.$Na_2O$−61.4.$K_2O$+8.1.(MgO+ZnO)≥0 mol %. In particular embodiments, the glass comprises: from about 7 mol % to about 26 mol % $Al_2O_3$; from 0 mol % to about 9 mol % $B_2O_3$; from about 11 mol % to about 25 mol % $Na_2O$; from 0 mol % to about 2.5 mol % $K_2O$; from 0 mol % to about 8.5 mol % MgO; and from 0 mol % to about 1.5 mol % CaO. This glass composition is described in U.S. Provisional Patent Application No. 61/503,734 by Matthew J. Dejneka et al., entitled "Ion Exchangeable Glass with High Compressive Stress," filed Jul. 1, 2011, the contents of which are incorporated herein by reference in their entirety.

Other types of glass compositions besides those mentioned above and besides alkali-aluminosilicate glass composition may be used for the 3D cover glass. For example, alkali-aluminoborosilicate glass compositions may be used for the 3D cover glass. In some embodiments, the glass compositions used are ion-exchangeable glass compositions, which are generally glass compositions containing small alkali or alkaline-earth metals ions that can be exchanged for large alkali or alkaline-earth metal ions. Additional examples of ion-exchangeable glass compositions may be found in U.S. Pat. No. 7,666,511 (Ellison et al; 20 Nov. 2008), U.S. Pat. No. 4,483,700 (Forker, Jr. et al.; 20 Nov. 1984), and U.S. Pat. No. 5,674,790 (Araujo; 7 Oct. 1997) and U.S. patent application Ser. No. 12/277,573 (Dejneka et al.; 25 Nov. 2008), Ser. No. 12/392,577 (Gomez et al.; 25 Feb. 2009), Ser. No. 12/856,840 (Dejneka et al.; 10 Aug. 2010), Ser. No. 12/858,490 (Barefoot et al.; 18 Aug. 18, 2010), and Ser. No. 13/305,271 (Bookbinder et al.; 28 Nov. 2010).

In some embodiments, the 3D cover glass is made by thermal reforming from a 2D glass sheet as already described above. In some embodiments, the 2D glass sheet is extracted from a pristine sheet of glass formed by a fusion process. The pristine nature of the glass may be preserved up until the glass is subjected to a strengthening process, such as an ion-exchange chemical strengthening process.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A cover glass article, comprising:
   a three-dimensional shape comprising
   an inside surface;
   an outside surface; and
   at least one bend comprising both the inside and outside surfaces, the at least one bend having a bend radius from about 1 mm to about 20 mm;
   wherein each of the inside and outside surfaces has a surface roughness ($R_a$) less than 1 nm and is free of indentations having diameters larger than 150 μm; and
   a wall thickness in the range from 0.3 mm to 3 mm, wherein the variation in the wall thickness is ±15% or less.

2. The cover glass article of claim 1, wherein each of the inside and outside surfaces has a surface roughness ($R_a$) less than 0.7 nm.

3. The cover glass article of claim 1, wherein at least one of the inside and outside surfaces has a surface roughness ($R_a$) less than 0.3 nm.

4. The cover glass article of claim 1, wherein a variation in the wall thickness is within ±10% or less.

5. The cover glass article of claim 1, wherein the glass body further comprises less than ten non-indentation defects observable by the unaided human eye at 1000 lux in a 25 mm×25 mm area on any of the surface.

6. The cover glass article of claim 1, wherein the glass body has a flat section.

7. The cover glass article of claim 6, wherein the flatness of the flat section is better than ±150 μm over a 10 mm×10 mm area.

8. The cover glass article of claim 6, wherein the flatness of the flat section is better than ±50 μm over a 25 mm×25 mm area.

9. The cover glass article of claim 1, wherein the at least one bend section is a spline.

10. The cover glass article of claim 1, wherein the glass body has an optical transmission greater than 85% at 1 mm thickness in a wavelength range of 400 nm to 800 nm.

11. The cover glass article of claim 1, wherein the glass body has a compressive stress greater than 300 MPa.

12. The cover glass article of claim 1, wherein the cover glass is tempered.

13. The cover glass article of claim 12, wherein the glass body is chemically tempered.

14. The cover glass article of claim 1, wherein the glass body comprises an ion-exchanged glass.

15. The cover glass article of claim 14, wherein the ion-exchanged glass has a depth of layer of greater than 15 μm.

16. The cover glass article of claim 1, wherein the glass body is adapted for covering an electronic device having a flat display.

17. The cover glass article of claim 16, wherein the electronic device is a telephone, monitor, television, handheld device, or tablet.

18. A cover glass article, comprising:
    a three-dimensional shape comprising
    an inside surface;
    an outside surface; and
    at least one bend comprising both the inside and outside surfaces, the at least one bend section having a bend radius from about 1 mm to about 20 mm;
    wherein each of the inside and outside surfaces has a surface roughness (Ra) less than 1 nm and is free of indentations having diameters larger than 150 μm; and
    a wall thickness in the range from 0.3 mm to 3 mm, wherein the variation in the wall thickness is ±150 μm or less.

19. The cover glass article of claim 18, wherein each of the inside and outside surfaces has a surface roughness ($R_a$) less than 0.7 nm.

20. The cover glass article of claim 18, wherein at least one of the inside and outside surfaces has a surface roughness ($R_a$) less than 0.3 nm.

21. The cover glass article of claim 18, wherein a variation in the wall thickness is +100 μm or less.

22. The cover glass article of claim 18, wherein the glass body further comprises less than ten non-indentation defects observable by the unaided human eye at 1000 lux in a 25 mm×25 mm area on any of the surface.

23. The cover glass article of claim 18, wherein the glass body has a flat section.

24. The cover glass article of claim 23, wherein the flatness of the flat section is better than ±150 μm over a 10 mm×10 mm area.

25. The cover glass article of claim 23, wherein the flatness of the flat section is better than ±50 μm over a 25 mm×25 mm area.

26. The cover glass article of claim 18, wherein the at least one bend section is a spline.

27. The cover glass article of claim 18, wherein the glass body has an optical transmission greater than 85% at 1 mm thickness in a wavelength range of 400 nm to 800 nm.

28. The cover glass article of claim 18, wherein the glass body has a compressive stress greater than 300 MPa.

29. The cover glass article of claim 18, wherein the cover glass is tempered.

30. The cover glass article of claim 29, wherein the glass body is chemically tempered.

31. The cover glass article of claim 18, wherein the glass body comprises an ion-exchanged glass.

32. The cover glass article of claim 18, wherein the ion-exchanged glass has a depth of layer of greater than 15 μm.

33. The cover glass article of claim 18, wherein the glass body is adapted for covering an electronic device having a flat display.

34. The cover glass article of claim 33, wherein the electronic device is a telephone, monitor, television, handheld device, or tablet.

35. The cover glass article of claim 1, wherein the three-dimensional shape is thermally reformed.

36. The cover glass article of claim 18, wherein the three-dimensional shape is thermally reformed.

* * * * *

UNITED STATES PATENT AND TRADEMARK OFFICE
CERTIFICATE OF CORRECTION

PATENT NO. : 9,512,029 B2
APPLICATION NO. : 13/774238
DATED : December 6, 2016
INVENTOR(S) : Karl David Ehemann et al.

Page 1 of 1

It is certified that error appears in the above-identified patent and that said Letters Patent is hereby corrected as shown below:

In the Claims

In Column 10, Line 2, Claim 18, after "one bend" delete "section".

In Column 10, Line 5, Claim 18, delete "(Ra)" and insert -- $(R_a)$ --, therefor.

In Column 10, Line 19, Claim 21, delete "+100" and insert -- $\pm 100$ --, therefor.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*